(12) United States Patent
Takeguchi et al.

(10) Patent No.: US 8,659,713 B2
(45) Date of Patent: Feb. 25, 2014

(54) ACTIVE MATRIX SUBSTRATE AND LIQUID CRYSTAL DEVICE

(75) Inventors: Toru Takeguchi, Tokyo (JP); Osamu Tanina, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 402 days.

(21) Appl. No.: 13/005,781

(22) Filed: Jan. 13, 2011

(65) Prior Publication Data

US 2011/0299005 A1    Dec. 8, 2011

(30) Foreign Application Priority Data

Jun. 2, 2010    (JP) .................................. 2010-126530

(51) Int. Cl.
*G02F 1/136*    (2006.01)
(52) U.S. Cl.
USPC ............................................ 349/43; 349/111
(58) Field of Classification Search
None
See application file for complete search history.

(56) References Cited

U.S. PATENT DOCUMENTS

| 5,796,116 | A | 8/1998 | Nakata et al. |
| 6,271,062 | B1 | 8/2001 | Nakata et al. |
| 6,917,393 | B2 * | 7/2005 | Sakamoto et al. .............. 349/43 |
| 7,405,783 | B2 * | 7/2008 | Aoki et al. .................... 349/110 |
| 2003/0025848 | A1 | 2/2003 | Sera et al. |
| 2009/0027580 | A1 * | 1/2009 | Kurokawa et al. .............. 349/43 |

FOREIGN PATENT DOCUMENTS

| JP | 8-97436 | 4/1996 |
| JP | 2003-17505 | 1/2003 |
| JP | 2003-131261 | 5/2003 |

* cited by examiner

*Primary Examiner* — Richard Kim
(74) *Attorney, Agent, or Firm* — Oblon, Spivak, McClelland, Maier & Neustadt, L.L.P.

(57) ABSTRACT

In an active matrix substrate, the source electrode side and/or the drain electrode side of a crystalline semiconductor film extends to an area located outside both the thin-film transistor and the gate electrode, and a metal light-shielding film is provided, in the same layer as the gate electrode, between the contacting portion between the source electrode or the source line and the crystalline semiconductor film and the gate electrode, and/or between the contacting portion between the drain electrode and the crystalline semiconductor film and the gate electrode. An impurity-implanted region implanted with n-type impurity may be formed between the contacting portion between the source electrode or the source line and the crystalline semiconductor film and the gate electrode, and/or between the contacting portion between the drain electrode and the crystalline semiconductor film and the gate electrode.

7 Claims, 14 Drawing Sheets

ACTIVE MATRIX SUBSTRATE AND LIQUID CRYSTAL DEVICE

INCORPORATION BY REFERENCE

This application is based upon and claims the benefit of priority from Japanese patent application No. 2010-126530, filed on Jun. 2, 2010, the disclosure of which is incorporated herein in its entirety by reference.

BACKGROUND OF THE INVENTION

1. Field of the Invention

The present invention relates to an active matrix substrate on which a plurality of pairs of a thin-film transistor (TFT) and a pixel electrode are arranged in array, and a liquid crystal device including the active matrix substrate.

2. Description of Related Art

Liquid crystal devices, which are a type of flat panel displays, have various merits including low power consumption, small size, and light weight, and because of such merits, they have been widely used in the monitors of personal computers and mobile information terminals, and in the display devices of TV sets and the like. Further, EL (electroluminescence) devices, which are self-luminous type devices and are characterized by a wide viewing angle, a high contrast, a high-speed response, and the like, have also come into use as devices for flat panel displays.

As for the thin-film transistor (TFT) that is used as a pixel switching element in active matrix type liquid crystal devices or EL devices, the MIS structure including a channel layer composed of at least one semiconductor film (typically, silicon film) has been widely adopted.

There are various types of TFTs including an inverted staggered type and a top-gate type. Further, the semiconductor film forming the channel layer also has various types including an amorphous semiconductor film and a crystalline semiconductor film. The types of the TFT and the semiconductor film are selected as appropriate based on the usage and the required properties of the device in which they are provided.

In recent years, in order to achieve a narrower frame and/or a reduction in costs in the liquid crystal devices and EL devices, the development of drive-circuit-integrated type devices, in which drive circuits such as a source driver and a gate driver using driving TFTs are formed on the same substrate as the pixel area including pixel switching TFTs, has been in progress. By forming the drive circuits on the same substrate as the pixel area, the costs required for external IC chips can be reduced. Further, since the need for the area in which the IC chips are mounted can be eliminated, it is possible to achieve a narrower frame.

Since a larger driving voltage is applied on the driving TFTs for a longer time in comparison to the pixel switching TFTs, the degradation of the electrical characteristics is larger in the driving TFTs than in the pixel switching TFTs. Therefore, for the driving TFTs, it is desirable to use a crystalline semiconductor film which has high reliability and large mobility. Examples of the crystalline semiconductor film include a polycrystalline semiconductor film and a microcrystalline semiconductor film.

In the past, as a method of forming a crystalline semiconductor film such as a polycrystalline semiconductor film and a microcrystalline semiconductor film, there are several well-known methods including a method of transforming an amorphous semiconductor film into a polycrystalline state by laser annealing in which the amorphous semiconductor film is formed on a gate insulating film, which serves as a primary film, and then irradiated with a laser beam (Japanese Unexamined Patent Application Publication No. 2003-17505 (claim 1 and so on) (Patent literature 1)), and a method in which a microcrystalline semiconductor film is directly formed by a plasma CVD (Chemical Vapor Deposition) method (Japanese Unexamined Patent Application Publication No. H08-97436 (paragraph 0041 and so on) (Patent literature 2)).

To produce TFTs, a plurality of photolithography processes need to be carried out. However, it has been desired to reduce the number of such photolithography processes in terms of the productivity. Therefore, in the inverted staggered type TFTs, back-channel etch type TFTs in which the rear surface of the channel is etched have been often used because the number of necessary photolithography processes for the production is relatively small.

When a crystalline semiconductor film is used as the channel layer in the above-described back-channel etch type TFT, an amorphous semiconductor film is stacked on the crystalline semiconductor film. This process is necessary because of the following reason.

When the back-channel etching is performed, it is very difficult to ensure the etching selectivity between the ohmic contact layer (n-layer) connected to the source/drain electrode and the semiconductor film of the channel layer. Therefore, in consideration of variations in the film-thickness of the n-layer within the substrate surface and variations in the etching rate, it is necessary to increase the film-thickness of the semiconductor film of the channel layer and sufficiently increase the etching time.

However, in the method disclosed in Patent literature 1 in which an amorphous semiconductor film is transformed into a polycrystalline state by laser annealing, if the first-formed amorphous semiconductor film is formed with a large thickness, the amorphous semiconductor film cannot be sufficiently melted to the bottom. As a result, it is very difficult to form a crystalline semiconductor film having excellent crystallinity through the entire thickness to the interface portion with the gate insulating film. Further, in the method disclosed in Patent literature 2 in which a microcrystalline semiconductor film is directly formed by a plasma CVD method, the film-formation rate of the microcrystalline semiconductor film is very low. As a result, there is a problem that when the semiconductor film is formed with a large thickness, the throughput is significantly lowered.

Therefore, an amorphous semiconductor film having a relatively high film-formation rate is stacked on the crystalline semiconductor film formed by laser annealing or a plasma CVD method in order to ensure the process margin for the back-channel etching.

The crystalline semiconductor film has higher hole mobility than that of the amorphous semiconductor film. Therefore, it is believed that because of light-irradiation from a backlight or the like provided in a transmission type liquid crystal device, for example, hole-electron pairs are generated and they are moved through the crystalline semiconductor film by the application of an external voltage. When a voltage is applied between the source and drain electrodes of a TFT while applying a negative bias voltage to the gate electrode, hole carriers flow between the source and drain electrodes and therefore a leak current is generated. When the liquid crystal device is used as a display device, crosstalk and the like could appear due to this leak current, thus deteriorating the display quality.

To cope with the above-described problem, it is conceivable to suppress the generation of electron-hole pairs due to the photo excitation by disposing all the semiconductor films within the formation area of the gate electrodes and thereby blocking light coming from behind the semiconductor films by the gate electrodes. However, even if such countermeasures are taken, when a TFT is in an Off-state, a negative bias voltage is applied to the gate electrode and a hole accumulation layer is thereby formed in the crystalline semiconductor film. As a result, a current flows through the contacting portion between the source/drain electrode and the crystalline semiconductor film, thus causing a leak current.

In Japanese Unexamined Patent Application Publication No. 2003-131261 (Patent Literature 3), metal light-shielding films (3, 5) are formed on a substrate and a TFT is formed above these layers with an insulating layer (8) interposed therebetween (claim 1 and FIG. 2). However, in this configuration, it is necessary to form metal light-shielding films (3, 5) and an insulating film (6) in addition to the other essential components of the TFT. As a result, the number of photolithography processes increases and therefore it is not desirable in terms of the productivity.

SUMMARY OF THE INVENTION

The present invention has been made in view of the above-described circumstances, and an exemplary object thereof is to provide an active matrix substrate which includes a crystalline semiconductor film and has an excellent transistor characteristic, and in which the occurrence of an optically-induced leak current is suppressed.

In this specification, the term "crystalline semiconductor film" includes a microcrystalline semiconductor film, a polycrystalline semiconductor film, and the like.

An active matrix substrate in accordance with a first exemplary aspect of the present invention includes a plurality of pairs of an inverted staggered type thin-film transistor and a pixel electrode arranged in array, the inverted staggered thin-film type transistor including a gate electrode and a gate insulating film sequentially formed on an insulative substrate, a channel layer including a crystalline semiconductor film and an amorphous semiconductor film sequentially formed on the gate insulating film, and a source electrode and a drain electrode formed on the channel layer with a space therebetween, wherein a source electrode side and/or a drain electrode side of the crystalline semiconductor film extends to an area located outside both the thin-film transistor and the gate electrode, and the active matrix substrate further includes a metal light-shielding film formed, in a same layer as the gate electrode, between a contacting portion between the source electrode or a source line connected to the source electrode and the crystalline semiconductor film and the gate electrode and/or between a contacting portion between the drain electrode and the crystalline semiconductor film and the gate electrode.

An active matrix substrate in accordance with a second exemplary aspect of the present invention includes a plurality of pairs of an inverted staggered type thin-film transistor and a pixel electrode arranged in array, the inverted staggered thin-film type transistor including a gate electrode and a gate insulating film sequentially formed on an insulative substrate, a channel layer including a crystalline semiconductor film and an amorphous semiconductor film sequentially formed on the gate insulating film, and a source electrode and a drain electrode formed on the channel layer with a space therebetween, wherein a source electrode side and/or a drain electrode side of the crystalline semiconductor film extends to an area located outside both the thin-film transistor and the gate electrode, and an impurity-implanted region implanted with an n-type impurity is formed, in the crystalline semiconductor film, between a contacting portion between the source electrode or a source line connected to the source electrode and the crystalline semiconductor film and the gate electrode and/or between a contacting portion between the drain electrode and the crystalline semiconductor film and the gate electrode.

The present invention can provide an active matrix substrate which includes a crystalline semiconductor film and has an excellent transistor characteristic, and in which the occurrence of an optically-induced leak current is suppressed.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

[First Exemplary Embodiment]

Figure 1A:
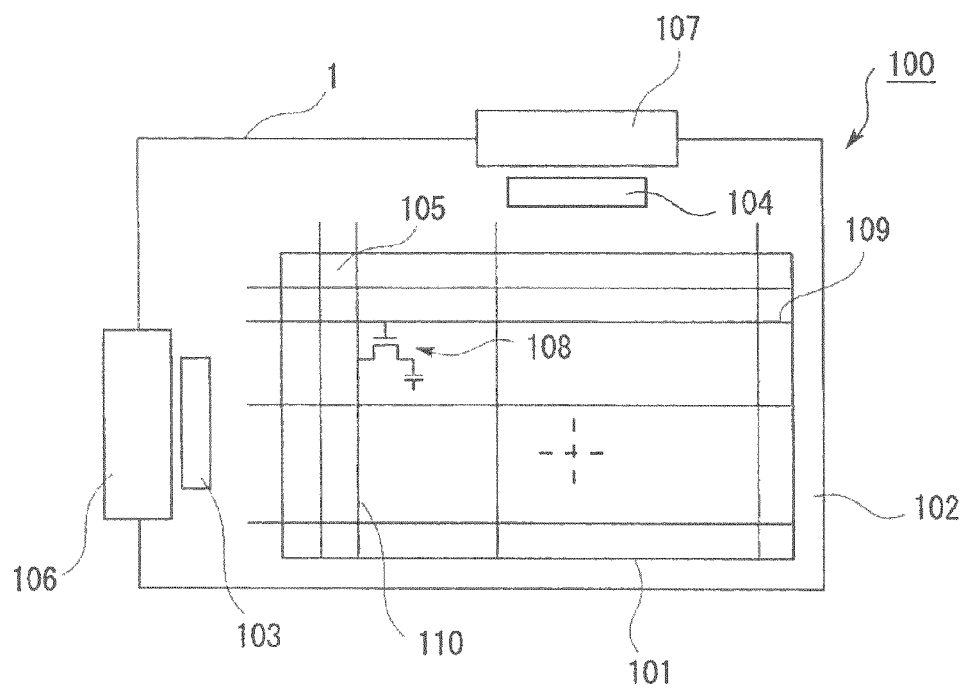
FIG. 1A is a schematic overall plane view of an active matrix substrate in accordance with a first exemplary embodiment of the present invention.
Figure 1B:
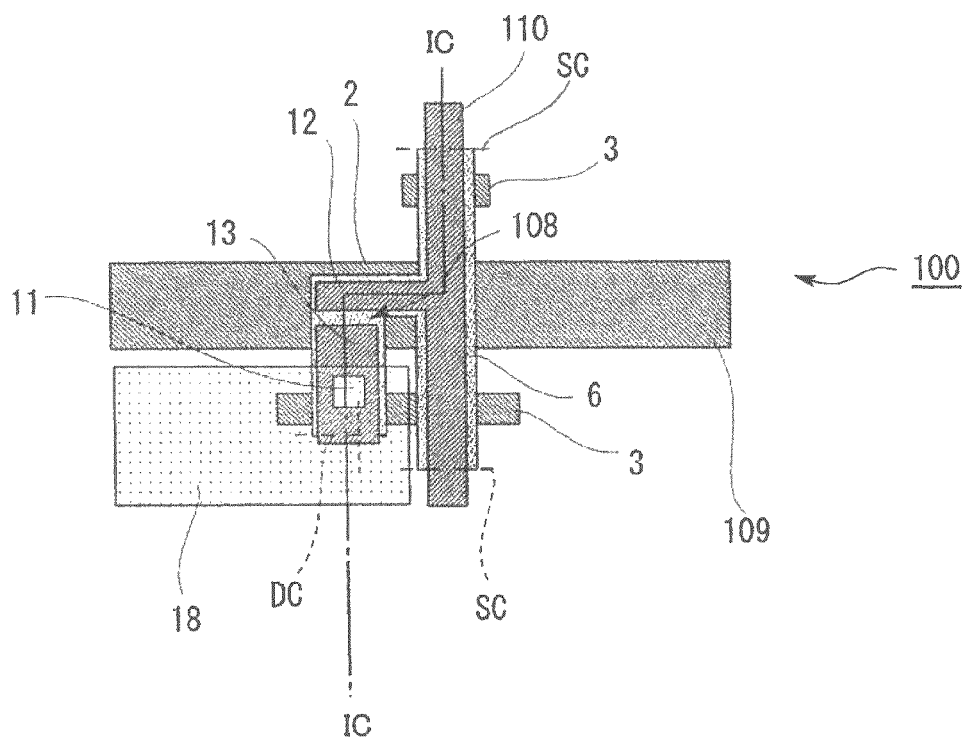
FIG. 1B is a plane view of a substantial part of an active matrix substrate in accordance with a first exemplary embodiment of the present invention.
Figure 1C:
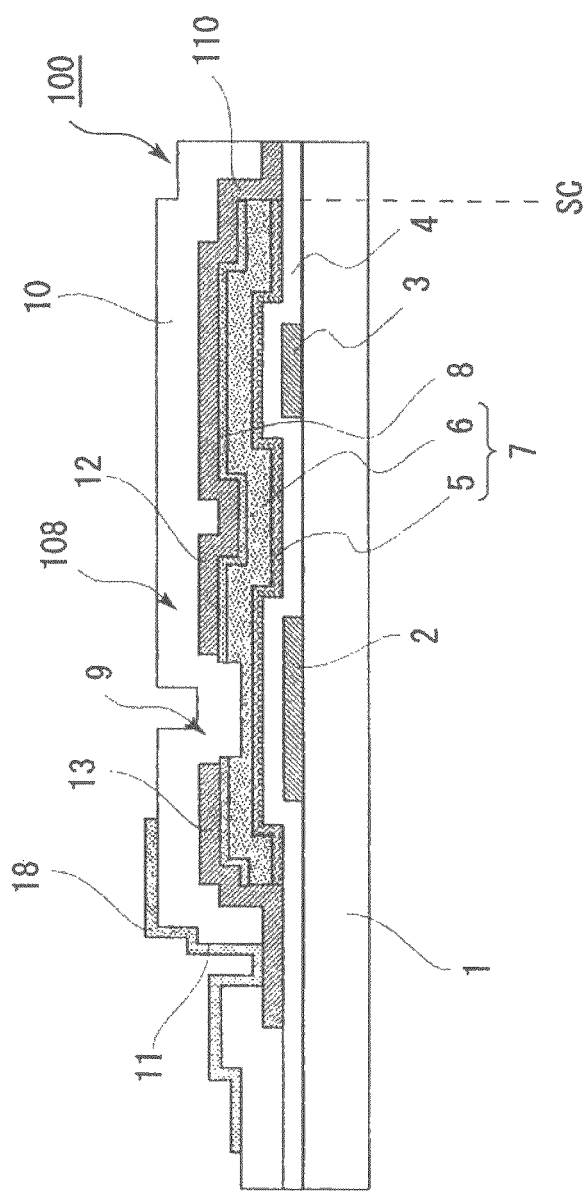
FIG. 1C is a cross-section of a substantial part of an active matrix substrate in accordance with a first exemplary embodiment of the present invention.

An active matrix substrate in accordance with a first exemplary embodiment of the present invention and a liquid crystal device including the active matrix substrate are explained with reference to the drawings. FIG. 1A shows a schematic overall plane view of an active matrix substrate in accordance with this exemplary embodiment of the present invention. Further, FIGS. 1B and 1C show a plane view and a cross-section, respectively, of a substantial part of the active matrix substrate.

For the sake of easier visual understanding, the scale and the position of each component may be changed as appropriate from the actual scale and potion. In FIG. 1C, which is a cross-section taken along the line IC-IC of FIG. 1B, the illustration of a metal light-shielding film 3 on the drain electrode side is omitted. Further, hatching is also omitted as appropriate in FIG. 1C.

The active matrix substrate 100 in accordance with this exemplary embodiment can be suitably used in various electrooptical devices including active matrix type liquid crystal (display) devices and organic EL (display) devices. This exemplary embodiment is explained by using a transmission type liquid crystal display device as an example.

As shown in FIG. 1A, the active matrix substrate 100 in accordance with this exemplary embodiment includes a pixel area 101 in which images are displayed, and a frame area 102 which is disposed so as to surround the pixel area 101. In the pixel area 101, a plurality of gate lines (scanning signal lines) 109 and a plurality of source lines (display signal lines) 110 are formed in a lattice pattern so that they cross each other at right angles. Each of the areas partitioned by the plurality of gate lines 109 and the plurality of source lines 110 serves as a pixel 105.

A scanning signal drive circuit 103 and a display signal drive circuit 104 are provided in the frame area 102 of the active matrix substrate 100. The gate lines 109 are connected to the scanning signal drive circuit 103, and the source lines 110 are connected to the display signal drive circuit 104.

External wiring units 106 and 107 are connected to the scanning signal drive circuit 103 and display signal drive circuit 104 respectively. Each of the external wiring units 106 and 107 is constructed from a wiring board such as a FPC (Flexible Printed Circuit).

Various external signals are supplied to the scanning signal drive circuit 103 and the display signal drive circuit 104 through the external wiring units 106 and 107. The scanning signal drive circuit 103 supplies gate signals (scanning signals) to the gate lines 109 based on external control signals. The display signal drive circuit 104 supplies display signals to the source lines 110 based on external control signals and external display data. In this way, a display voltage is supplied to each pixel 105 according to the display data.

As shown in FIG. 1B, one thin-film transistor (TFT) 108 that serves as a pixel switching element and one pixel electrode 18 are formed in each pixel 105. In the pixel 105, the TFT 108 is formed in the vicinity of the intersection between the gate line 109 and the source line 110. As viewed as the whole active matrix substrate 100, a plurality of pairs each consisting of a TFT 108 and a pixel electrode 18 are arranged in array. Note that, in some cases, more than one TFT is provided in one pixel 105.

On the uppermost surface of the active matrix substrate 100, an alignment layer (not shown) is formed.

A transmission type liquid crystal device (not shown) includes a liquid crystal panel in which, for example, the above-described active matrix substrate 100 and an opposed substrate (color-filter substrate) including an opposed electrode (common electrode), a color filter, a black-matrix (BM) that serves as an optical shield between pixels, an alignment layer, and the like are disposed opposite to each other with a liquid crystal layer interposed therebetween. Further, the liquid crystal device also includes a polarizing plate and a retardation plate on the outer side of each of both substrates of the liquid crystal panel, and also includes a backlight unit on the outer side of one of the substrates. In some cases, the opposed electrode is disposed on the active matrix substrate 100 side.

In the liquid crystal device, the TFT 108, which is a switching element, is turned on by a gate signal supplied through the gate line 109, and a display voltage is thereby applied through the source line 110 to the pixel electrode 18 connected to the drain electrode 13 of the TFT 108 (see FIGS. 1B and 1C). Then, an electric field is generated between the pixel electrode 18 and the opposed electrode according to the display voltage.

In the liquid crystal device, the alignment direction of the liquid crystals is changed by the electric field between the pixel electrode 18 and the opposed electrode. As a result, the polarized state of light passing through the liquid crystal layer is changed and the amount of light passing through the polarizing plate located on the display-screen side is thereby changed. By using this feature, it is possible to modulate light for each pixel 105 and thereby display a desired image.

As shown in FIG. 1C, the TFT 108 is an inverted staggered type TFT including a gate electrode 2 and a gate insulating film 4 sequentially formed on an insulative substrate 1, a channel layer 7 including a crystalline semiconductor film 5 and an amorphous semiconductor film 6 sequentially formed on the gate insulating film 4, and a source electrode 12 and a drain electrode 13 formed on the channel layer 7 with a space therebetween.

In this exemplary embodiment, an ohmic contact layer (low resistance film) 8 is formed between the channel layer composed of the crystalline semiconductor film 5 and the amorphous semiconductor film 6 and the source electrode 12 and the drain electrode 13.

The substrate 1 is an optically-transparent insulative substrate 1 such as a glass substrate and a quartz substrate.

The gate insulating film 4 is formed from an $SiN_x$ film, an $SiO_2$ film, or a laminated film thereof, and is formed so as to cover the gate electrode 2 and a metal light-shielding film 3 (which is described later).

In this exemplary embodiment, the crystalline semiconductor film 5 is a polycrystalline or a microcrystalline silicon film.

In this exemplary embodiment, the ohmic contact layer 8 is an N-type amorphous silicon film doped with an impurity. A part of the ohmic contact layer 8 located between the source electrode 12 and the drain electrode 13 (channel portion 9) is removed, so that the ohmic contact layer 8 has a source region and a drain region on the respective sides of the removed portion.

The source electrode 12 is connected to the source region of the ohmic contact layer 8, and the drain electrode 13 is connected to the drain region of the ohmic contact layer 8. In this exemplary embodiment, the source electrode 12 and the source line 110 are formed in an integral manner.

In the active matrix substrate 100, an interlayer insulating film (protective insulating film) 10 is formed over the entire substrate surface so as to cover the source electrode 12, the drain electrode 13, and the channel portion 9. Further, a pixel electrode 18 is formed on the interlayer insulating film 10. The pixel electrode 18 is connected to the drain electrode 13 through a pixel drain contact hole 11 that is formed through the interlayer insulating film 10.

As shown in FIGS. 1B and 1C, the source electrode 12 side of the crystalline semiconductor film 5 and the amorphous semiconductor film 6 extends to an area located outside both the TFT 108 and the gate electrode 2, and a metal light-shielding film 3 is formed between the contacting portion SC between the source line 110 connected to the source electrode 12 and the crystalline semiconductor film 5 and the gate electrode 2 in the same layer as the gate electrode 2. In this exemplary embodiment, as shown in FIG. 1B, the source electrode 12 side of the crystalline semiconductor film 5 and the amorphous semiconductor film 6 extends upward and downward in the figure along the source line 110 on both sides of the gate electrode 2. Then, a metal light-shielding film 3 is formed in each of the areas that are formed by extending the crystalline semiconductor film 5 and the amorphous semiconductor film 6 upward and downward in the figure on both sides of the gate electrode 2.

As shown in FIG. 1B, the drain electrode 13 side of the crystalline semiconductor film 5 and the amorphous semiconductor film 6 extends to an area located outside both the TFT 108 and the gate electrode 2, and a metal light-shielding film 3 is formed between the contacting portion DC between the drain electrode 13 and the crystalline semiconductor film 5 and the gate electrode 2 in the same layer as the gate electrode 2.

The metal light-shielding film 3 functions as a film that blocks light coming from the backlight and thereby prevents the light from entering the crystalline semiconductor film 5.

With the above-described configuration, the generation of holes due to the light-irradiation is suppressed in the formation area of the metal light-shielding film 3 in the crystalline semiconductor film 5, thus suppressing the formation of a hole accumulation layer. In the conventional configuration, it is believed that because of the holes induced by the application of a negative bias voltage to the gate electrode and the holes generated by the light-irradiation, hole carriers flow between the source and the drain electrodes and that a leak current is thereby generated. By contrast, in this exemplary embodiment in accordance with the present invention, since the flow of hole carriers is temporarily blocked by the metal light-shielding film 3, the flow of hole carriers between the source and the drain electrodes can be suppressed.

In this exemplary embodiment, since the flow of hole carriers between the source and the drain electrodes can be suppressed, it is possible to reduce the optically-induced leak current that is caused when a negative bias voltage is applied to the gate electrode 2 of the TFT 108.

Next, an example of a manufacturing method of an active matrix substrate 100 is explained with reference to FIGS. 2A to 2E. Each of FIGS. 2A to 2E is a cross-section corresponding to FIG. 1C.

Figure 2A:
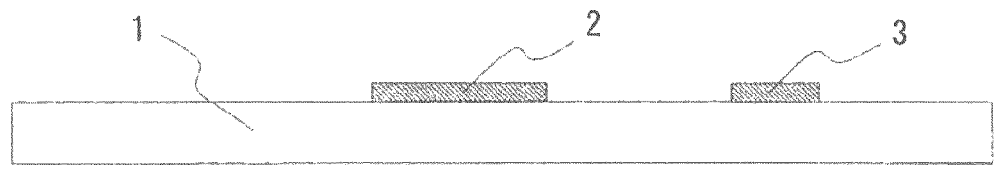
FIG. 2A is a cross-section for illustrating a manufacturing step of an active matrix substrate in accordance with a first exemplary embodiment of the present invention.

Firstly, a process shown in FIG. 2A is carried out.

A metal film composed of gate-electrode material is formed on an optically-transparent insulative substrate 1 such as a glass substrate and a quartz substrate by DC-magnetron sputtering. This metal film is patterned into a desired shape by photolithography and wet-etching so that a gate electrode 2 and a metal light-shielding film 3 are formed.

In a first exemplary example, a non-alkali glass substrate was used as the insulative substrate 1. Further, an aluminum alloy film (aluminum alloy film obtained by adding a certain amount of nickel and neodymium to aluminum) having a thickness of 200 nm was formed as the gate electrode 2 and the metal light-shielding film 3. In the wet-etching, an etching solution containing a phosphoric acid as the main ingredient was used.

Although the end faces of the gate electrode 2 and the metal light-shielding film 3 are perpendicular to the substrate surface in the figures, these end faces are preferably formed into a tapered shape. By forming the end faces into a tapered shape, the coating property of a gate insulating film 4, which is formed later, is improved, thus preventing the withstand-voltage failure.

Figure 2B:
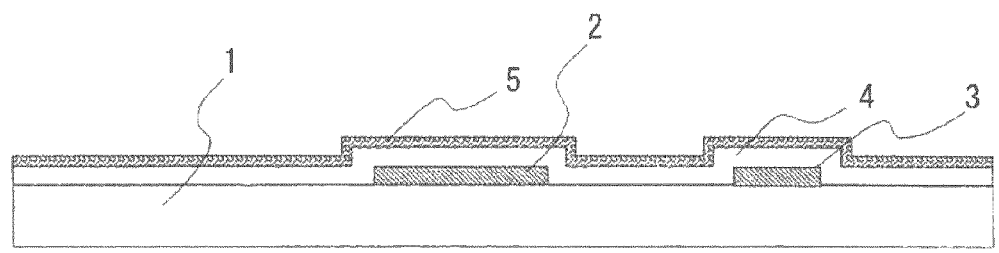
FIG. 2B is a cross-section for illustrating a manufacturing step of an active matrix substrate in accordance with a first exemplary embodiment of the present invention.

Next, a process shown in FIG. 2B is carried out.

A gate insulating film 4 is formed on the substrate 1 on which the gate electrode 2 and the metal light-shielding film 3 were already formed by using a plasma CVD method.

In the first exemplary example, a silicon nitride film ($SiN_x$ film) having a thickness of about 300 nm was formed, and then a silicon oxide film ($SiO_2$ film) having a thickness of about 100 nm was formed in order to form a gate insulating film 4 composed of a laminated film of an $SiN_x$ film and an $SiO_2$ film. In this laminated structure, the interface portion with a crystalline semiconductor film 5, which is formed later, becomes $SiO_2$.

With this structure, it is possible to form a crystalline semiconductor film 5 that will have excellent crystallinity from the interface with the gate insulating film 4 in a later process, thus having excellent crystallinity through the entire thickness. Therefore, this structure is preferable.

The thickness of the gate insulating film 4 is not limited to the above-described thickness. That is, the thickness of the gate insulating film 4 may be determined by taking the required withstand voltage, the insulating film capacitance, and the like into consideration.

Next, a crystalline semiconductor film 5 is formed on the gate insulating film 4.

In this exemplary embodiment, an amorphous semiconductor film is formed on the gate insulating film 4 by a plasma CVD method and high-temperature annealing process is performed on the amorphous semiconductor film. After that, the amorphous semiconductor film is crystallized by leaser annealing to form a crystalline semiconductor film 5.

An amorphous semiconductor film formed by a plasma CVD method contains a large amount of hydrogen. Therefore, to reduce the amount of hydrogen, it is preferable to perform high-temperature annealing after the amorphous semiconductor film is formed. By performing the annealing process, it is possible to suppress the roughness on the semiconductor film surface that would be otherwise caused by sudden release of hydrogen due to a temperature rise when the amorphous semiconductor film is crystallized by leaser annealing.

An inert-gas such as nitrogen is sprayed on the amorphous semiconductor film after the high-temperature annealing process in order to lower the oxygen concentration on the surface of the amorphous semiconductor film. A pulsed laser beam is applied to the amorphous semiconductor film in this state. At this process, the laser beam is passed through a certain optical system to be shaped into a beam shape, and then is applied to the amorphous semiconductor film. By performing laser scanning on the amorphous semiconductor film, the amorphous semiconductor film is temporarily melted and then crystallized as the semiconductor film solidified again.

In the first exemplary example, an amorphous silicon film having a thickness of about 50 nm was formed as the amorphous semiconductor film. After the film formation, the substrate was put and kept for 30 minutes inside a chamber that was heated to 400° C. in advance in a low-vacuumed nitrogen atmosphere.

After that, nitrogen was sprayed on the amorphous semiconductor film to lower the oxygen concentration on the surface of the amorphous semiconductor film, and then laser annealing was carried out by using pulsed laser.

As for the laser beam, excimer laser (oscillation wavelength: 308 nm) was used. Further, the laser beam was shaped into a linear beam shape of about 200 μm×200 mm. Further, the irradiation energy was 200 mJ/cm$^2$ and the feeding pitch of the scanning was 15 μm. By applying a laser beam to the amorphous semiconductor film with the above-described irradiation energy for multiple times, the semiconductor film was able to be crystallized through the entire thickness to the interface with the SiO$_2$ film. In the first exemplary example, it was possible to form a polycrystalline semiconductor film (pc-Si film) having excellent crystallinity in contact with the SiO$_2$ film without leaving any amorphous portion.

Although the irradiation energy density was set to 250 mJ/cm$^2$ in the first exemplary example, the irradiation energy density is not limited to this value. The irradiation energy density is preferably 200 to 350 mJ/cm$^2$. When the irradiation energy density is lower than 200 mJ/cm$^2$, the amorphous semiconductor film could not be sufficiently crystallized. Therefore, there is a possibility that the S-value could increase and/or the mobility could decrease. On the other hand, when the irradiation energy density is higher than 350 mJ/cm$^2$, problems such as roughness on the surface of the semiconductor film, lowered crystallinity, and damage in the gate electrode could occur. Therefore, it is undesirable.

The crystalline semiconductor film 5 can be directly formed by a plasma CVD method (see Patent literature 2 (paragraph 0041 and so on) cited in "Description of Related Art").

Figure 2C:
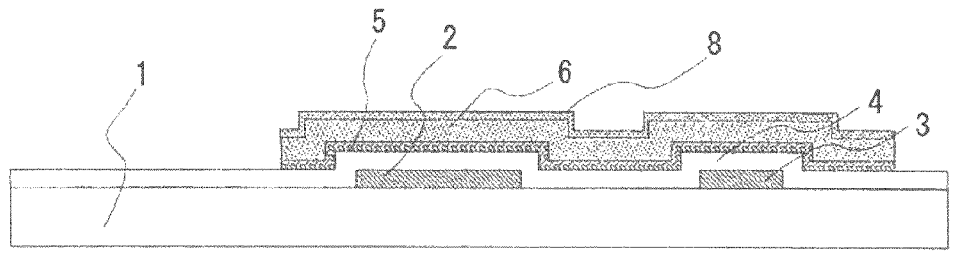
FIG. 2C is a cross-section for illustrating a manufacturing step of an active matrix substrate in accordance with a first exemplary embodiment of the present invention.

Next, a process shown in FIG. 2C is carried out.

The resultant substrate is cleansed with a hydrofluoric-acid-based chemical agent to remove the natural oxidization film on the surface of the crystalline semiconductor film 5, and then an amorphous semiconductor film 6 and an ohmic contact layer (low resistance film) 8 are sequentially formed by a plasma CVD method.

In the first exemplary example, an intrinsic amorphous silicon (i-a-Si) film having a thickness of about 150 nm was formed as the amorphous semiconductor film 6. Further, an amorphous silicon (n$^+$a-Si) film containing phosphorus as an impurity element and having a thickness of about 30 nm was formed as the ohmic contact layer 8.

Next, the ohmic contact layer 8, the amorphous semiconductor film 6, and the crystalline semiconductor film 5 are sequentially patterned into desired shapes by photolithography and dry-etching. As a result, a part of the surface of the gate insulating film 4 is exposed.

In the first exemplary example, a mixed gas of CF$_4$ and O$_2$ was used as the etching gas. In this way, it was possible to carry out the etching while making the photoresist recede gradually, and thereby to form the pattern end faces of the ohmic contact layer 8, the amorphous semiconductor film 6, and the crystalline semiconductor film 5 into a tapered shape. By forming these end faces into a tapered shape, the coating property of a metal film, which is formed later, is improved, thus preventing the wiring line from being snapped at the above-described pattern edge portion of the semiconductor film.

Figure 2D:
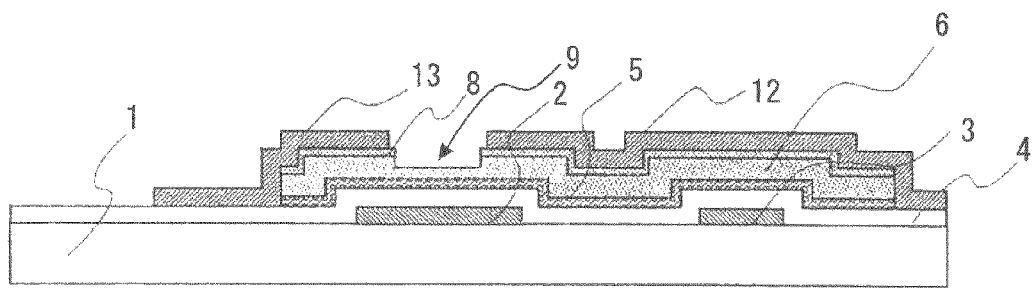
FIG. 2D is a cross-section for illustrating a manufacturing step of an active matrix substrate in accordance with a first exemplary embodiment of the present invention.

Next, a process shown in FIG. 2D is carried out.

A metal film, which is used to form a source electrode 12 and a drain electrode 13, is formed on the ohmic contact layer 8 by DC-magnetron sputtering.

In the first exemplary example, a Cr film having a thickness of about 200 nm was formed as the metal film.

Next, the metal film is patterned into a desired shape by photolithography and wet-etching so that a source electrode 12 and a drain electrode 13 are formed.

In the first exemplary example, a chemical agent composed of a perchloric acid and cerium ammonium nitrate was used as the etching solution for the wet-etching.

Next, a part of the ohmic contact layer 8 located between the source electrode 12 and the drain electrode 13 is removed by dry-etching. Specifically, the ohmic contact layer 8 is etched by using the source electrode 12 and the drain electrode 13 as a mask. In this process, a part of the surface portion of the amorphous semiconductor film 6 located between the source electrode 12 and the drain electrode 13 is also partially removed. With this process, the ohmic contact layer 8 is divided into a source region and a drain region located on both sides of the channel portion 9.

In the first exemplary example, the total etching depth was about 80 nm. Since the ohmic contact layer 8 was formed with the thickness of 30 nm, the etching depth in the amorphous semiconductor film 6 was about 50 nm.

Figure 2E:
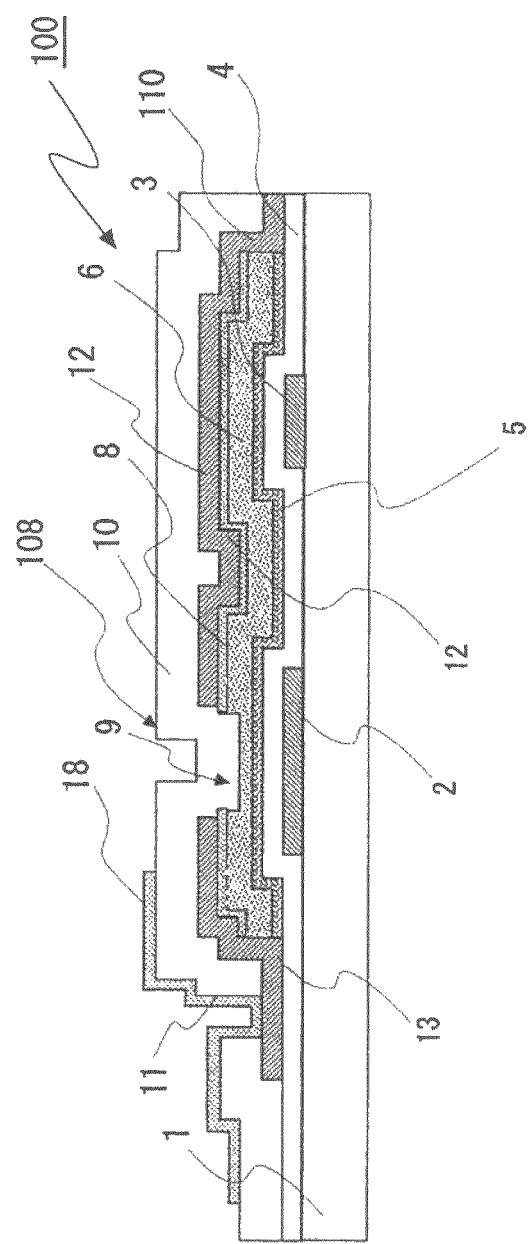
FIG. 2E is a cross-section for illustrating a manufacturing step of an active matrix substrate in accordance with a first exemplary embodiment of the present invention.

Next, a process shown in FIG. 2E is carried out.

An interlayer insulating film 10 is formed by a plasma CVD method, and a contact hole 11 is formed in a predetermined area by photolithography and dry-etching.

In the first exemplary example, a silicon nitride film having a thickness of about 300 nm was formed as the interlayer insulating film 10.

Next, an optically-transparent conductive film composed of ITO (indium-tin oxide), IZO (indium-zinc oxide), or the like is formed and then patterned into a desired shape by photolithography so that a pixel electrode 18 and a terminal electrode (not shown) are formed.

In the first exemplary example, an amorphous transparent conductive film having excellent workability was formed by DC-magnetron sputtering using a mixed gas of an Ar gas, an O$_2$ gas, and a H$_2$O gas. As for the etching, wet-etching was carried out by using a chemical agent containing an oxalic acid as the main ingredient.

After the unnecessary resist is removed, the amorphous transparent conductive film is crystallized by carrying out annealing. As a result, a TFT 108 and an active matrix substrate 100 are completed.

In this exemplary embodiment, the source electrode 12 side of the crystalline semiconductor film 5 extends to an area located outside both the TFT 108 and the gate electrode 2, and the metal light-shielding film 3 is formed between the contacting portion SC between the source line 110 connected to the source electrode 12 and the crystalline semiconductor film 5 and the gate electrode 2 in the same layer as the gate electrode 2.

Further, in this exemplary embodiment, the drain electrode 13 side of the crystalline semiconductor film 5 extends to an area located outside both the TFT 108 and the gate electrode 2, and the metal light-shielding film 3 is formed between the contacting portion DC between the drain electrode 13 and the crystalline semiconductor film 5 and the gate electrode 2 in the same layer as the gate electrode 2.

In the above-described configuration in accordance with this exemplary embodiment, it is believed that the formation of a hole accumulation layer within the crystalline semiconductor film 5 is suppressed in the shielded area where the metal light-shielding film 3 is formed and that the movement of hole carriers between the source and drain electrodes can be thereby suppressed. As a result, it is possible to reduce the optically-induced leak current that is caused when a negative bias voltage is applied to the gate electrode 2 of the TFT 108. Therefore, for example, it is possible to prevent holes generated by light-irradiation from a backlight or the like from flowing between the source and drain electrodes through the crystalline semiconductor film 5 having a high hole mobility, thus preventing the deterioration in the display quality due to crosstalk and the like.

In this exemplary embodiment, since the gate electrode 2 and the metal light-shielding film 3 can be formed in the same process, the productivity is also good.

As has been explained so far, in accordance with this exemplary embodiment of the present invention, it is possible to provide an active matrix substrate 100 which includes a crystalline semiconductor film 5 and has a good productivity as well as an excellent transistor characteristic, and in which the occurrence of an optically-induced leak current is suppressed.

[Second Exemplary Embodiment]

Figure 3A:
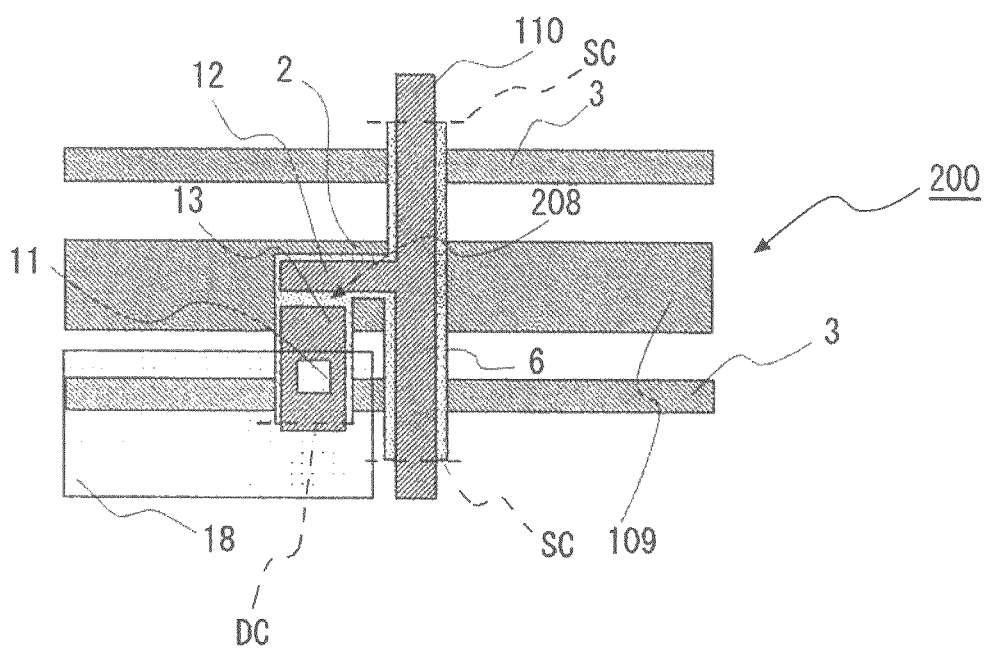
FIG. 3A is a plane view of a substantial part of an active matrix substrate in accordance with a second exemplary embodiment of the present invention.
Figure 3B:
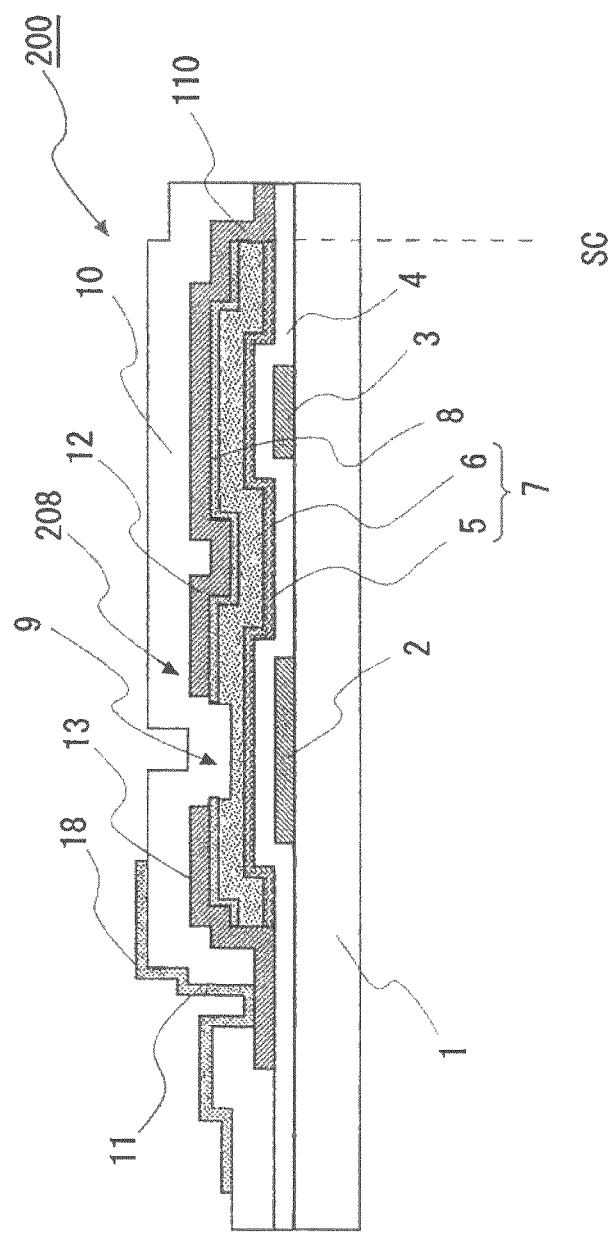
FIG. 3B is a cross-section of a substantial part of an active matrix substrate in accordance with a second exemplary embodiment of the present invention.

An active matrix substrate in accordance with a second exemplary embodiment of the present invention is explained with reference to the drawings. FIGS. 3A and 3B show a plane view and a cross-section, respectively, of a substantial part of an active matrix substrate in accordance with this exemplary embodiment of the present invention. The same components as those of the first exemplary embodiment are denoted by the same signs, and their explanations are omitted.

As shown in FIG. 3B, a TFT 208 and an active matrix substrate 200 have similar cross-section structure to that of the first exemplary embodiment.

Similarly to the first exemplary embodiment, as shown in FIGS. 3A and 3B, the source electrode 12 side of the crystalline semiconductor film 5 and the amorphous semiconductor film 6 extends to an area located outside both the TFT 208 and the gate electrode 2, and a metal light-shielding film 3 is formed between the contacting portion SC between the source line 110 connected to the source electrode 12 and the crystalline semiconductor film 5 and the gate electrode 2 in the same layer as the gate electrode 2.

Similarly to the first exemplary embodiment, as shown in FIG. 3A, the drain electrode 13 side of the crystalline semiconductor film 5 and the amorphous semiconductor film 6 extends to an area located outside both the TFT 208 and the gate electrode 2, and a metal light-shielding film 3 is formed between the contacting portion DC between the drain electrode 13 and the crystalline semiconductor film 5 and the gate electrode 2 in the same layer as the gate electrode 2.

Further, as shown in FIG. 3A, the metal light-shielding film 3 is formed as a metal wiring line extending to the frame area 102 (see FIG. 1A) in parallel with the gate line 109 in this exemplary embodiment. The metal light-shielding film 3, which is formed as the metal wiring line, is connected to an external terminal in the frame area 102, so that a positive voltage can be externally applied to the metal light-shielding film 3.

In this exemplary embodiment, the metal light-shielding film 3 also functions as a film that blocks light coming from the backlight and thereby prevents the light from entering the crystalline semiconductor film 5.

Similarly to the first exemplary embodiment, the metal light-shielding film 3, which is used to block light from the backlight, is provided between the contacting portion SC between the source line 110 and the crystalline semiconductor film 5 and the gate electrode 2, and between the contacting portion DC between the drain electrode 13 and the crystalline semiconductor film 5 and the gate electrode 2 in this exemplary embodiment. Therefore, the formation of a hole accumulation layer within the crystalline semiconductor film 5 can be suppressed in the shielded area where the metal light-shielding film 3 is formed.

Further, this exemplary embodiment has such a configuration that an external voltage can be applied by using the metal light-shielding film 3 as a metal wiring line. With this configuration, a voltage can be applied, in the crystalline semiconductor film 5, to an area between the contacting portion SC between the source line 110 and the crystalline semiconductor film 5 and the gate electrode 2, and an area between the contacting portion DC between the drain electrode 13 and the crystalline semiconductor film 5 and the gate electrode 2 from the metal light-shielding film 3 located below the crystalline semiconductor film 5 through the gate insulating film 4.

Note that if a positive voltage is applied, electrons are accumulated in the vicinity of the interface between the crystalline semiconductor film 5 and the gate insulating film 4. On the other hand, if a negative voltage is applied, holes are accumulated in the vicinity of the interface between the crystalline semiconductor film 5 and the gate insulating film 4.

Since this exemplary embodiment has such a configuration that a positive voltage can be externally applied to the metal light-shielding film 3, it is possible to accumulate electrons in the vicinity of the interface between the crystalline semiconductor film 5 and the gate insulating film 4 in an area between the contacting portion SC between the source line 110 and the crystalline semiconductor film 5 and the gate electrode 2 and an area between the contacting portion DC between the drain electrode 13 and the crystalline semiconductor film 5 and the gate electrode 2. Therefore, the formation of a hole accumulation layer within the crystalline semiconductor film 5 can be reliably suppressed in the area where the metal light-shielding film 3 is formed.

Accordingly, this exemplary embodiment can suppress the movement of hole carriers between the source and drain electrodes at a higher level than the first exemplary embodiment. Therefore, it is possible to reduce the optically-induced leak current that is caused when a negative bias voltage is applied to the gate electrode 2 of the TFT 208 at a higher level.

The active matrix substrate 200 in accordance with this exemplary embodiment can be manufactured by a similar manufacturing process to that of the first exemplary embodiment.

As a second exemplary example, an active matrix substrate 200 that was identical to the substrate of the first exemplary example except that the pattern of the metal light-shielding film 3 was changed to the pattern shown in FIG. 3A was obtained.

Figure 4:
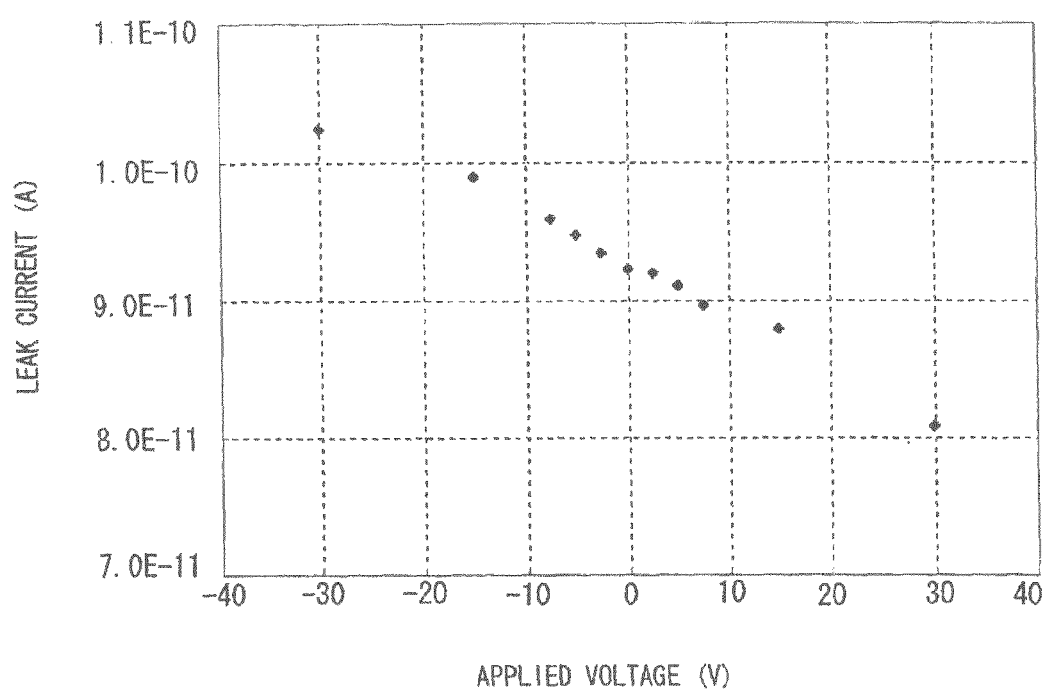
FIG. 4 is a graph showing the dependence of the leak current on the applied voltage exhibited when voltages are applied to the metal light-shielding film.

FIG. 4 shows a graph showing the dependence of the leak current on the applied voltage exhibited when various voltages are applied to the metal light-shielding film 3. From this graph, it can be seen that the amount of the leak current is reduced by applying a positive voltage to the metal light-shielding film 3 and that the reducing effect increases with an increase in the applied voltage.

That is, it is preferable that a large positive voltage should be applied to the metal light-shielding film 3. Specifically, the voltage applied to the metal light-shielding film 3 is preferably higher than the threshold voltage of the TFT. By using the applied voltage like this, the optically-induced leak current can be effectively reduced. In the example shown in FIG. 4, the threshold voltage was 4.2 V.

In this exemplary embodiment, the optically-induced leak current that is caused when a negative bias voltage is applied to the gate electrode 2 of the TFT can be effectively reduced. Therefore, for example, it is possible to prevent holes generated by light-irradiation from a backlight or the like from flowing between the source and drain electrodes through the crystalline semiconductor film 5 having a high hole mobility, thus preventing the deterioration in the display quality due to crosstalk and the like.

In this exemplary embodiment, since the gate electrode 2 and the metal light-shielding film 3 can be also formed in the same process, the productivity is also good.

As has been explained so far, in accordance with this exemplary embodiment of the present invention, it is possible to provide an active matrix substrate 200 which includes a crystalline semiconductor film 5 and has a good productivity as well as an excellent transistor characteristic, and in which the occurrence of an optically-induced leak current is suppressed.

[Third Exemplary Embodiment]

Figure 5:
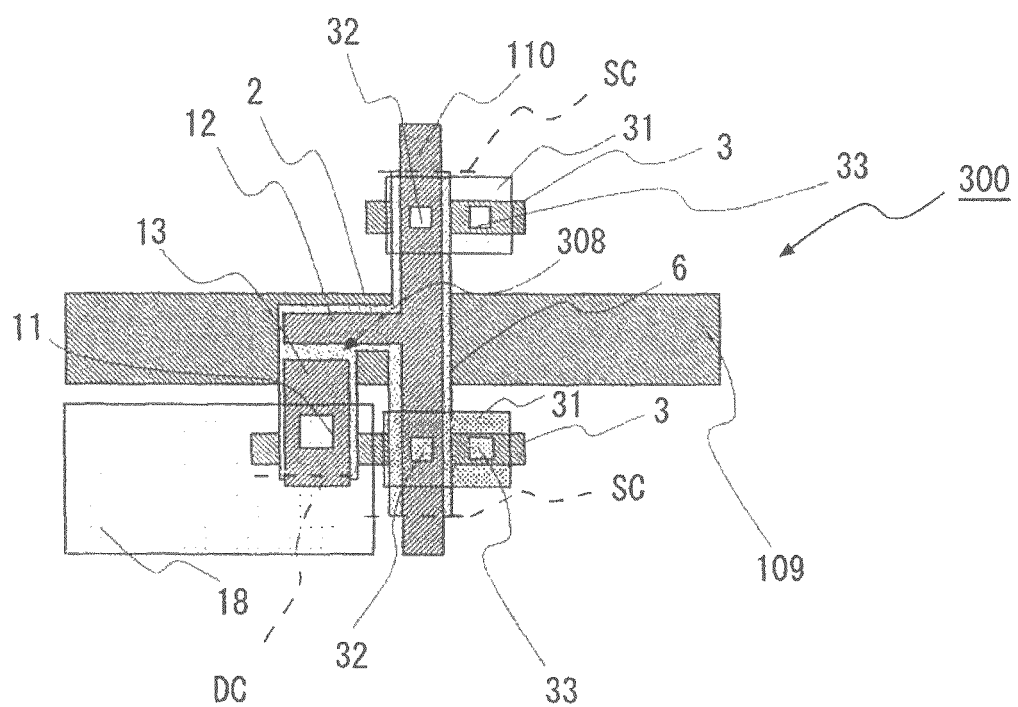
FIG. 5 is a plane view of a substantial part of an active matrix substrate in accordance with a third exemplary embodiment of the present invention.

An active matrix substrate in accordance with a third exemplary embodiment of the present invention is explained with reference to the drawings. FIG. 5 shows a plane view of a substantial part of an active matrix substrate in accordance with this exemplary embodiment of the present invention. The same components as those of the first exemplary embodiment are denoted by the same signs, and their explanations are omitted.

A TFT 308 and an active matrix substrate 300 in accordance with this exemplary embodiment have similar cross-section structure to that of the first exemplary embodiment except that a connection electrode 31 and contact holes 32 and 33 are provided in the this exemplary embodiment.

Similarly to the first exemplary embodiment, as shown in FIG. 5, the source electrode 12 side of the crystalline semiconductor film 5 and the amorphous semiconductor film 6 extends to an area located outside both the TFT 308 and the gate electrode 2, and a metal light-shielding film 3 is formed between the contacting portion SC between the source line 110 connected to the source electrode 12 and the crystalline semiconductor film 5 and the gate electrode 2 in the same layer as the gate electrode 2.

Similarly to the first exemplary embodiment, the drain electrode 13 side of the crystalline semiconductor film 5 and the amorphous semiconductor film 6 extends to an area located outside both the TFT 308 and the gate electrode 2, and a metal light-shielding film 3 is formed between the contacting portion DC between the drain electrode 13 and the crystalline semiconductor film 5 and the gate electrode 2 in the same layer as the gate electrode 2.

The second exemplary embodiment has such a configuration that a voltage can be externally applied by using the metal light-shielding film 3 as a metal wiring line. In this exemplary embodiment, the metal light-shielding film 3 is formed in a similar pattern to that of the first exemplary embodiment, and thus cannot serve as a wiring line to which an external voltage can be applied on its own. However, the metal light-shielding film 3 is electrically connected to the source line 110, and therefore a positive voltage can be externally applied to the metal light-shielding film 3 through the source line 110.

As shown in FIG. 5, a connection electrode 31 that is used to connect the source line 110 to the metal light-shielding film 3 is formed on the same layer as the pixel electrode 18 above the source line 110 and the metal light-shielding film 3. The connection electrode 31 is formed in the same process as the pixel electrode 18, and is composed of the same optically-transparent conductive film as the pixel electrode 18. The connection electrode 31 is connected to the source line 110 through a contact hole 32 formed through the interlayer insulating film 10, and also connected to the metal light-shielding film 3 through a contact hole 33 formed through the interlayer insulating film 10.

Similarly to the first and second exemplary embodiments, the metal light-shielding film 3, which is used to block light from the backlight, is provided between the contacting portion SC between the source line 110 and the crystalline semiconductor film 5 and the gate electrode 2, and between the contacting portion DC between the drain electrode 13 and the crystalline semiconductor film 5 and the gate electrode 2 in this exemplary embodiment. Therefore, the formation of a hole accumulation layer within the crystalline semiconductor film 5 can be suppressed in the shielded area where the metal light-shielding film 3 is formed.

Similarly to the second exemplary embodiment, a voltage can be externally applied to the metal light-shielding film 3 in this exemplary embodiment. With this configuration, a positive voltage can be applied, in the crystalline semiconductor film 5, to an area between the contacting portion SC between the source line 110 and the crystalline semiconductor film 5 and the gate electrode 2 and an area between the contacting portion DC between the drain electrode 13 and the crystalline semiconductor film 5 and the gate electrode 2 from the metal light-shielding film 3 located below the crystalline semiconductor film 5 through the gate insulating film 4. With this configuration, electrons can be accumulated in the vicinity of the interface between the crystalline semiconductor film 5 and the gate insulating film 4, and therefore the formation of a hole accumulation layer within the crystalline semiconductor film 5 can be reliably suppressed in the area where the metal light-shielding film 3 is formed.

Accordingly, this exemplary embodiment can also suppress the movement of hole carriers between the source and drain electrodes at a higher level than the first exemplary embodiment. Therefore, it is possible to reduce the optically-induced leak current that is caused when a negative bias voltage is applied to the gate electrode 2 of the TFT 308 at a higher level.

In this exemplary embodiment, the voltage applied to the metal light-shielding film 3 is also preferably higher than the threshold voltage of the TFT. By using the applied voltage like this, the optically-induced leak current can be effectively reduced.

In the second exemplary embodiment, a metal wiring line composed of the metal light-shielding film 3 is provided separately from the gate line and the source line of the active matrix substrate. In the configuration like this, an additional power supply needs to be provided to supply a voltage to the metal wiring line composed of the metal light-shielding film 3, thus increasing the power consumption. Note that the gate line and the metal wiring line composed of the metal light-shielding film are formed in the same layer. However, if these lines are short-circuited with each other even at one place due to a defective pattern or the like, their electrical potential become the same, thus making applying a desired voltage impossible and thereby causing a failure in the line.

In contrast to this, in this exemplary embodiment, since the source line 110 is used to apply a positive voltage to the metal light-shielding film 3, no additional power supply is required to supply a voltage to the metal light-shielding film 3. In addition, it is less likely to suffer from a short-circuit resulting from a defective pattern in the common layer.

In this exemplary embodiment, the optically-induced leak current that is caused when a negative bias voltage is applied to the gate electrode 2 of the TFT can be effectively reduced. Therefore, for example, it is possible to prevent holes generated by light-irradiation from a backlight or the like from flowing between the source and drain electrodes through the crystalline semiconductor film 5 having a high hole mobility, thus preventing the deterioration in the display quality due to crosstalk and the like.

The active matrix substrate 300 in accordance with this exemplary embodiment can be manufactured by a similar manufacturing process to that of the first exemplary embodiment.

In this exemplary embodiment, the gate electrode 2 and the metal light-shielding film 3 can be also formed in the same process. Further, the contact holes 32 and 33 can be formed in the same process as the formation of the pixel contact hole 11, and the connection electrode 31 can be formed in the same process as the pixel electrode 18. Therefore, the active matrix substrate 300 in accordance with this exemplary embodiment has a good productivity.

As has been explained so far, in accordance with this exemplary embodiment of the present invention, it is possible to provide an active matrix substrate 300 which includes a crystalline semiconductor film 5 and has a good productivity as well as an excellent transistor characteristic, and in which the occurrence of an optically-induced leak current is suppressed.

In the first to third exemplary embodiments, examples in which the metal light-shielding film 3 is formed both "between the contacting portion SC between the source line 110 and the crystalline semiconductor film 5 and the gate electrode 2" and "between the contacting portion DC between the drain electrode 13 and the crystalline semiconductor film 5 and the gate electrode 2" are explained. However, it is possible to provide an active matrix substrate in which the occurrence of an optically-induced leak current is suppressed more excellently than in the conventional technique by providing a metal light-shielding film 3 in at least either one of the areas.

[Fourth Exemplary Embodiment]

Figure 6:
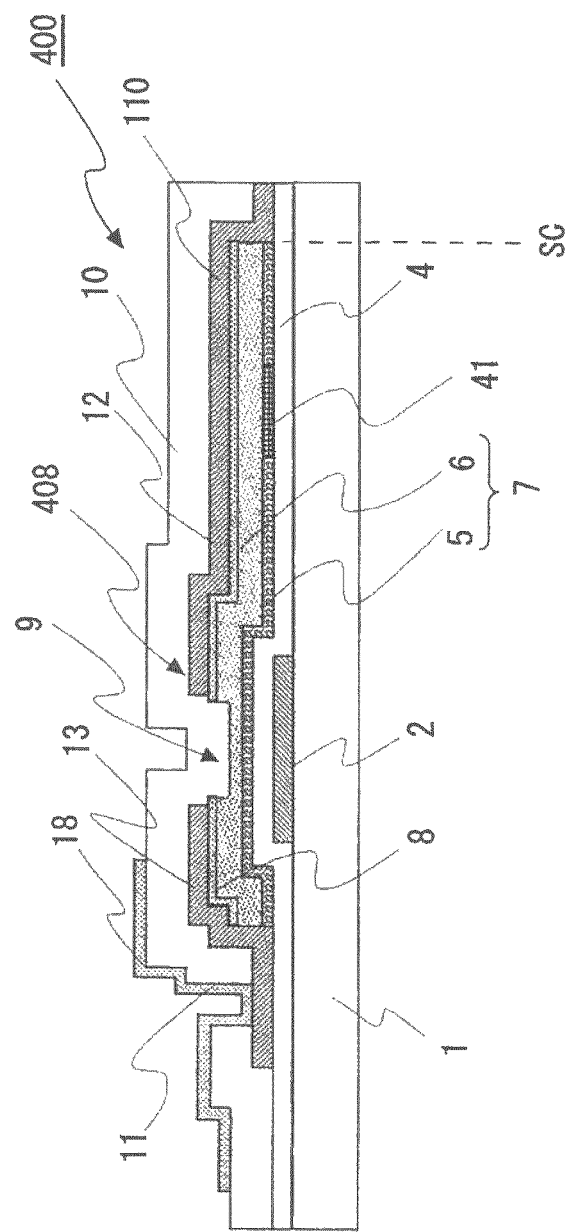
FIG. 6 is a cross-section of a substantial part of an active matrix substrate in accordance with a fourth exemplary embodiment of the present invention.

An active matrix substrate in accordance with a fourth exemplary embodiment of the present invention is explained with reference to the drawings. FIG. 6 shows a cross-section of a substantial part of an active matrix substrate in accordance with this exemplary embodiment of the present invention, and FIGS. 7A to 7F show a manufacturing process. The same components as those of the first exemplary embodiment are denoted by the same signs, and their explanations are omitted.

In the first to third exemplary embodiments, the metal light-shielding film 3 is provided between the contacting portion SC between the source line 110 and the crystalline semiconductor film 5 and the gate electrode 2, and between the contacting portion DC between the drain electrode 13 and the crystalline semiconductor film 5 and the gate electrode 2 in order to suppress the generation of hole-electron pairs due to light-irradiation in the shielded area where the metal light-shielding film 3 is formed and thereby to reduce the optically-induced leak current resulting from the movement of the holes carriers.

As shown in FIG. 6, in a active matrix substrate 400 in accordance with this exemplary embodiment of the present invention, the source electrode 12 side of the crystalline semiconductor film 5 extends to an area located outside both the TFT 408 and the gate electrode 2, and an impurity-implanted region 41 implanted with n-type impurity is formed between the contacting portion SC between the source electrode 110 and the crystalline semiconductor film 5 and the gate electrode 2 in the crystalline semiconductor film 5.

Instead of or in addition to the above-described configuration, the drain electrode 13 side of the crystalline semiconductor film 5 may extend to an area located outside both the TFT 408 and the gate electrode 2, and an impurity-implanted region 41 implanted with n-type impurity is formed between the contacting portion DC between the drain electrode 13 and the crystalline semiconductor film 5 and the gate electrode 2 (illustration is omitted, see figures for first and third exemplary embodiments) in the crystalline semiconductor film 5.

The impurity-implanted region 41 may be provided at least one of "between the contacting portion SC between the source line 110 and the crystalline semiconductor film 5 and the gate electrode 2" and "between the contacting portion DC between the drain electrode 13 and the crystalline semiconductor film 5 and the gate electrode 2".

With the above-described configuration, the formation of a hole accumulation layer can be suppressed in the region 41 of the crystalline semiconductor film 5 in which an n-type impurity is implanted. As a result, it is believed that the movement of hole carriers between the source and drain electrodes can be suppressed as in the above-described case Where the metal light-shielding film 3 is provided. Therefore, it is possible to reduce the optically-induced leak current that is caused when a negative bias voltage is applied to the gate electrode 2 of the TFT 408. Therefore, for example, it is possible to prevent holes generated by light-irradiation from a backlight or the like from flowing between the source and drain electrodes through the crystalline semiconductor film 5 having a high hole mobility, thus preventing the deterioration in the display quality due to crosstalk and the like.

An example of a manufacturing method of an active matrix substrate 400 is explained with reference to FIGS. 7A to 7F.

Figure 7A:
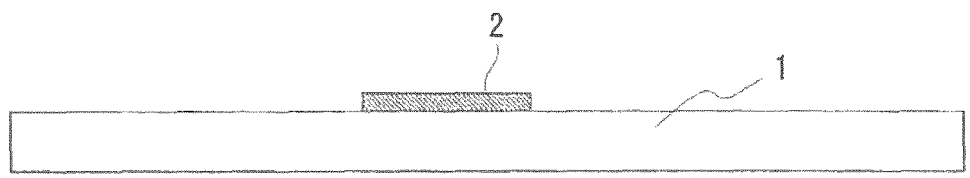
FIG. 7A is a cross-section for illustrating a manufacturing step of an active matrix substrate in accordance with a fourth exemplary embodiment of the present invention.
Figure 7B:
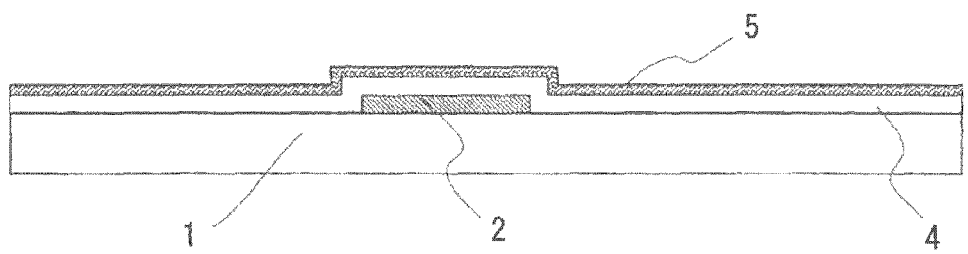
FIG. 7B is a cross-section for illustrating a manufacturing step of an active matrix substrate in accordance with a fourth exemplary embodiment of the present invention.

As shown in FIGS. 7A and 7B, a gate electrode 2 and a gate insulating film 4 are formed on a insulative substrate 1, and then a crystalline semiconductor film 5 is formed (the process is similar to that of the first exemplary embodiment).

Figure 7C:
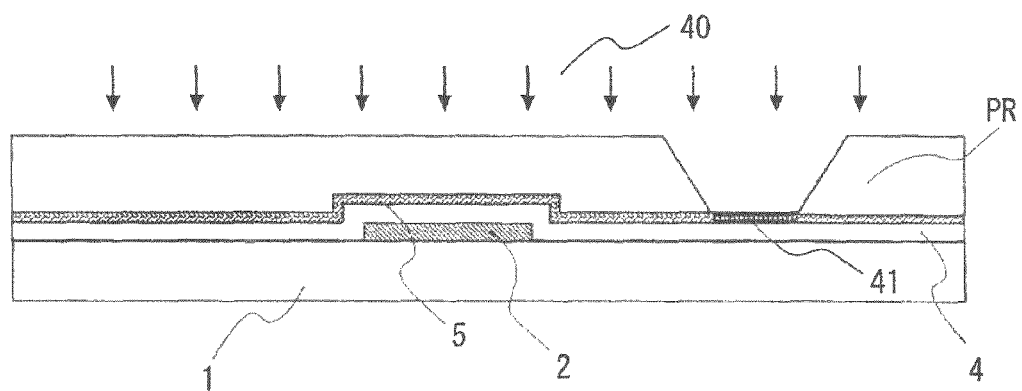
FIG. 7C is a cross-section for illustrating a manufacturing step of an active matrix substrate in accordance with a fourth exemplary embodiment of the present invention.

Next, as shown in FIG. 7C, a resist pattern PR is formed. The resist pattern PR has an opened area through which an impurity will be implanted. Then, by using this resist pattern PR as a mask, ions are implanted. In the figures, the sign "40" indicates ions to be implanted. After that, ashing is carried out on the resist surface, which is cured by the ion implantation. Then, the resist is removed by using a resist removing liquid.

In a fourth exemplary example, the ion implantation was carried out under the condition that acceleration voltage=5 kV, and dose quantity=$1.0 \times 10^{11}$ ions/cm$^2$.

Figure 7D:
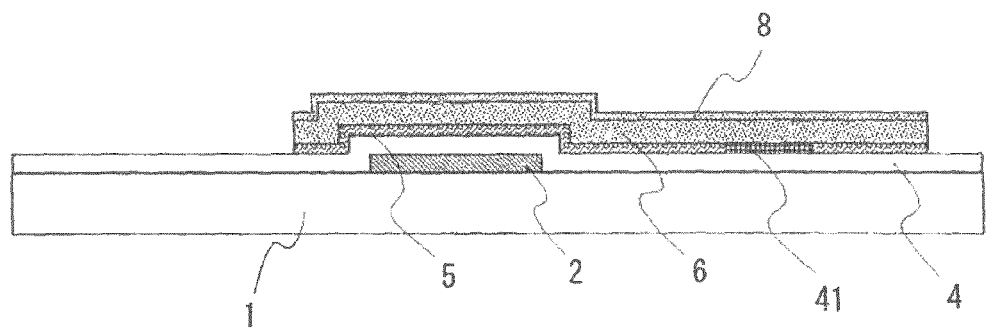
FIG. 7D is a cross-section for illustrating a manufacturing step of an active matrix substrate in accordance with a fourth exemplary embodiment of the present invention.
Figure 7E:
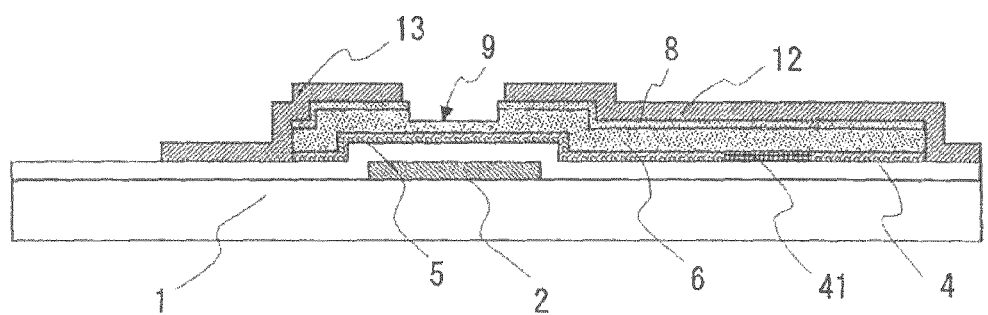
FIG. 7E is a cross-section for illustrating a manufacturing step of an active matrix substrate in accordance with a fourth exemplary embodiment of the present invention.
Figure 7F:
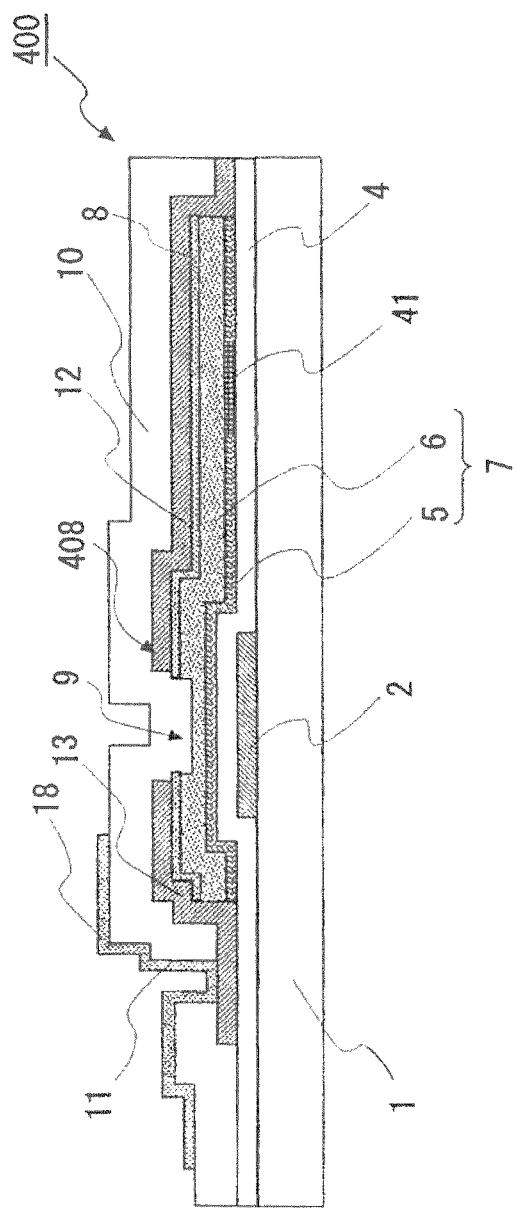
FIG. 7F is a cross-section for illustrating a manufacturing step of an active matrix substrate in accordance with a fourth exemplary embodiment of the present invention.

After that, the manufacturing process of the active matrix substrate 400 is completed through the processes shown in FIGS. 7D to 7F. The processes shown in FIGS. 7D to 7F are similar to those shown in FIGS. 2C to 2E of the first exemplary embodiment.

In this exemplary embodiment, the impurity-implanted region 41 can be formed by carrying out partial ion implantation after the formation of the crystalline semiconductor film 5, and therefore the productivity is good.

As has been explained so far, in accordance with this exemplary embodiment of the present invention, it is also possible to provide an active matrix substrate 400 which includes a crystalline semiconductor film 5 and has an excellent transistor characteristic, and in which the occurrence of an optically-induced leak current is suppressed.

[Design Change]

The present invention is not limited to the above-described exemplary embodiments, and various modifications can be made without departing from the spirit and scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An active matrix substrate comprising a plurality of pairs of an inverted staggered type thin-film transistor and a pixel electrode arranged in array, the inverted staggered thin-film type transistor comprising a gate electrode and a gate insulating film sequentially formed on an insulative substrate, a channel layer comprising a crystalline semiconductor film and an amorphous semiconductor film sequentially formed on the gate insulating film, and a source electrode and a drain electrode formed on the channel layer with a space therebetween, wherein a source electrode side and/or a drain electrode side of the crystalline semiconductor film extends to an area located outside both the thin-film transistor and the gate electrode, the active matrix substrate further comprises a metal light-shielding film formed, in a same layer as the gate electrode, between a contacting portion between the source electrode or a source line connected to the source electrode and the crystalline semiconductor film and the gate electrode and between a contacting portion between the drain electrode and the crystalline semiconductor film and the gate electrode, and the metal light-shielding film is not formed in extended portions which are located outside the contacting portions in a direction of the source line and the metal light-shielding film does not block light in the extended portions.

2. The active matrix substrate according to claim 1, wherein a the metal light-shielding film is configured to receive an externally applied positive voltage.

3. The active matrix substrate according to claim 2, wherein the positive voltage is higher than a threshold voltage of the thin-film transistor.

4. The active matrix substrate according to claim 2, wherein the metal light-shielding film constitutes a wiring line configured to receive an externally applied positive voltage.

5. The active matrix substrate according to claim 2, wherein the metal light-shielding film is electrically connected to the source line, and a positive voltage can be thereby externally applied to the metal light-shielding film through the source line.

6. A liquid crystal device comprising a liquid crystal panel comprising an active matrix substrate according to claim 1, an opposed substrate, and a liquid crystal layer sandwiched between these two substrates.

7. The liquid crystal device according to claim 6, further comprising a backlight, wherein the liquid crystal device is a transmission type liquid crystal device.

* * * * *